United States Patent
Taga

(10) Patent No.: US 11,627,688 B2
(45) Date of Patent: *Apr. 11, 2023

(54) CHARGER WITH ACTIVE VENTILATION AND WATER INTRUSION PREVENTION

(71) Applicant: MAKITA CORPORATION, Anjo (JP)

(72) Inventor: Hideyuki Taga, Anjo (JP)

(73) Assignee: MAKITA CORPORATION, Anjo (JP)

( * ) Notice: Subject to any disclaimer, the term of this patent is extended or adjusted under 35 U.S.C. 154(b) by 103 days.

This patent is subject to a terminal disclaimer.

(21) Appl. No.: 17/208,412

(22) Filed: Mar. 22, 2021

(65) Prior Publication Data

US 2021/0259140 A1 Aug. 19, 2021

Related U.S. Application Data

(63) Continuation of application No. 15/770,395, filed as application No. PCT/JP2016/069313 on Jun. 29, 2016, now Pat. No. 10,986,758.

(30) Foreign Application Priority Data

Oct. 28, 2015 (JP) ................................. 2015-211782

(51) Int. Cl.
*H02J 7/00* (2006.01)
*H05K 7/20* (2006.01)

(52) U.S. Cl.
CPC .......... *H05K 7/20909* (2013.01); *H02J 7/00* (2013.01); *H02J 7/0042* (2013.01); *H05K 7/20* (2013.01);
(Continued)

(58) Field of Classification Search
CPC ................................................ H05K 7/20909
(Continued)

(56) References Cited

U.S. PATENT DOCUMENTS

2008/0180910 A1* 7/2008 Tomioka ................. G06F 1/203
361/695
2010/0110631 A1 5/2010 Fong et al.
(Continued)

FOREIGN PATENT DOCUMENTS

CN 104283257 A 1/2015
JP 554-27332 U 2/1979
(Continued)

OTHER PUBLICATIONS

Sep. 3, 2021 Office Action issued in Chinese Patent Application No. 201680063738.X.
(Continued)

*Primary Examiner* — Edward Tso
*Assistant Examiner* — Ahmed H Omar
(74) *Attorney, Agent, or Firm* — Oliff PLC

(57) ABSTRACT

A charger is provided with an intake hole through which outside air may flow into the interior of and through the body of the charger, and an exhaust hole from which the outside air is discharged through by the driving a cooling fan. A first vertical wall that surrounds the intake hole or a region exposed to water that drops down the intake hole in a fence-shaped manner, and a second vertical wall that surrounds the exhaust hole or a region exposed to water that drops down the exhaust hole in a fence-shaped manner are provided on a bottom plate of the housing. An electrical circuit board is disposed outward of an area where the first vertical wall surrounds the intake hole and also disposed
(Continued)

outward of an area where the second vertical wall surrounds the region exposed to water that drops down the exhaust hole etc.

8 Claims, 10 Drawing Sheets

(52) U.S. Cl.
CPC ..... *H05K 7/20145* (2013.01); *H05K 7/20172* (2013.01); *H05K 7/20181* (2013.01); *H02J 2207/20* (2020.01); *Y02E 60/10* (2013.01); *Y02E 60/13* (2013.01)

(58) Field of Classification Search
USPC .......................................................... 320/107
See application file for complete search history.

(56) References Cited

U.S. PATENT DOCUMENTS

| | | |
|---|---|---|
| 2012/0229092 A1 | 9/2012 | Ro |
| 2012/0298330 A1 | 11/2012 | Mysse, III |
| 2013/0020329 A1 | 1/2013 | Lin et al. |
| 2015/0084591 A1* | 3/2015 | Kishima ............... H02J 7/0013 320/112 |
| 2015/0244034 A1 | 8/2015 | Taga |
| 2018/0317348 A1 | 11/2018 | Taga |

FOREIGN PATENT DOCUMENTS

| | | | |
|---|---|---|---|
| JP | H08-322114 A | 12/1996 | |
| JP | 2001-070139 A | 3/2001 | |
| JP | 2013121209 A | 6/2013 | |
| JP | 2013-192282 A | 9/2013 | |
| JP | 2015-019535 A | 1/2015 | |
| JP | 2016019841 * | 2/2015 | ............. Y02E 60/10 |
| JP | 2015-046413 A | 3/2015 | |
| KR | 20130045142 A | 5/2013 | |
| WO | 2017073112 A1 | 5/2017 | |

OTHER PUBLICATIONS

Sep. 13, 2016 International Search Report issued in International Patent Application No. PCT/JP2016/069313.
Sep. 13, 2016 Written Opinion issued in International Patent Application No. PCT/JP2016/069313.
Nov. 12, 2020 Office Action issued in Chinese Patent Application No. 201680063738.X.
May 3, 2019 extended European Search Report issued in European Patent Application No. 16859349.9.

* cited by examiner

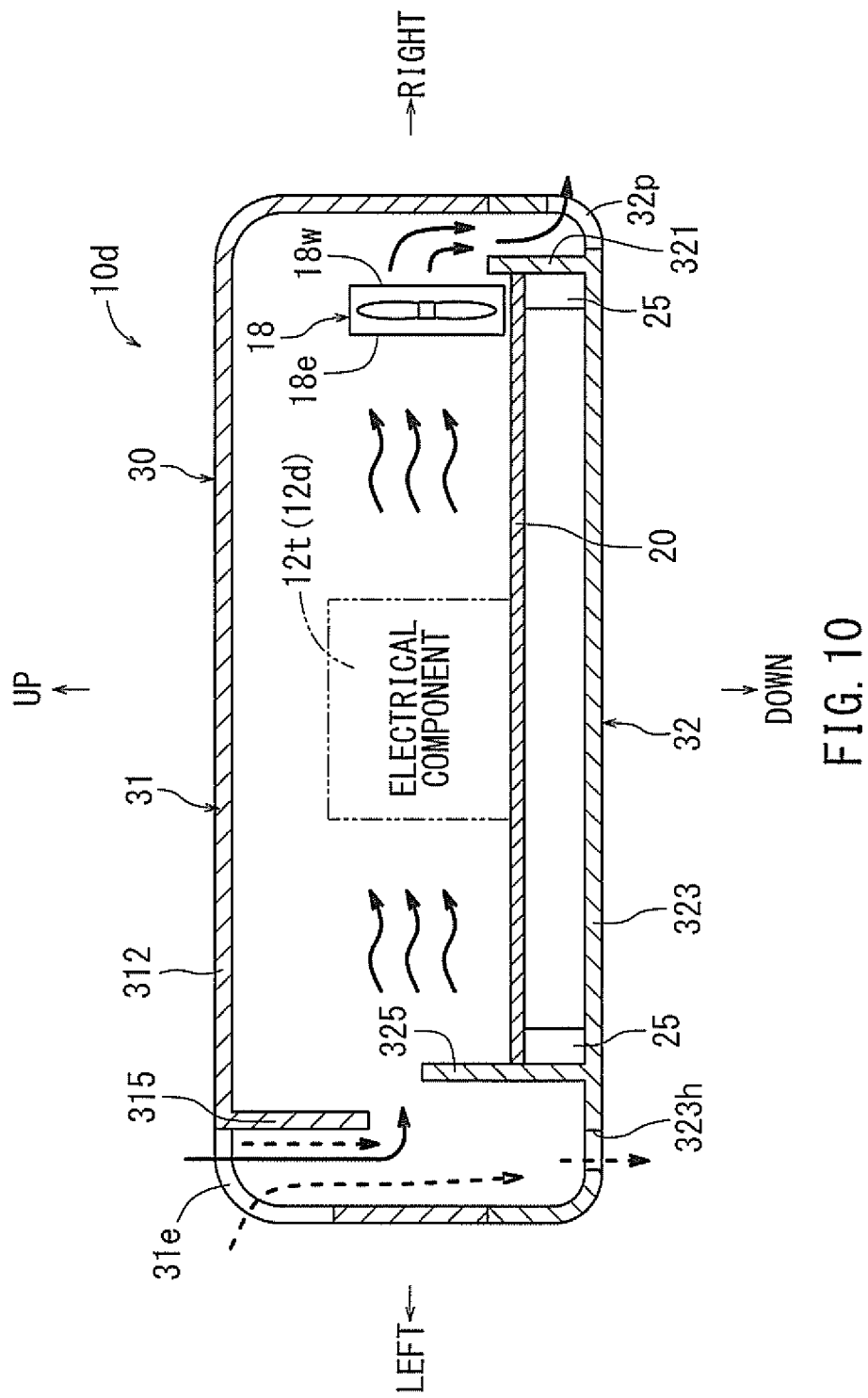

CHARGER WITH ACTIVE VENTILATION AND WATER INTRUSION PREVENTION

This application is a continuation of U.S. patent application Ser. No. 15/770,395, filed on Apr. 23, 2018, which is a national stage entry of PCT/JP2016/069313, filed on Jun. 29, 2016, which claims priority to Japanese Application 2015-211782, filed on Oct. 28, 2015, the disclosures of each of which are hereby incorporated by reference in their entirety.

TECHNICAL FIELD

The present invention relates to a charger with a housing including an electrical circuit board and a cooling fan.

BACKGROUND ART

Generally, a battery generates heat when charged. When, due to the heat generation of the battery, the temperature of the battery exceeds a predetermined value, charging efficiency decreases. To mitigate the effects of the temperature increase, a cooling fan for cooling the battery being charged is provided within the charger. In a charger in the prior art disclosed in Japanese Laid-Open Patent Publication No. 2013-192282, a cooling fan, which is attached to a fan case, is housed in the charging housing. An air inlet of the fan case is in fluid communication with an intake hole provided on a side surface of the housing, and a blow-off outlet of the fan case is configured to be connectable to the battery on the upper surface of the housing. Furthermore, the fan case is provided with an opening for guiding a part of the airflow in the interior of the fan case to the interior of the charger. Because of this configuration, when the cooling fan is driven, outside air flows from the intake hole on the side surface of the charger housing to the interior of the fan case, and outside air is supplied from the blow-off outlet of the fan case to the interior of the battery. Furthermore, electrical components in the charger are cooled by the air discharged from the fan case to the interior of the charger.

In recent years, the capacity of a battery has increased and thus in charging the battery, it is desirable to increase the charge current to the charger so as not to take a long time to charge the battery. However, in the configuration present in the prior art, such as the prior art mentioned above, where the cooling fan is used for cooling the battery as well as for cooling the charger, it may be difficult to suppress heat generation of the electrical components of the charger with an increased charge current. Because of this deficiency, it is necessary to provide a dedicated cooling fan in the housing of the charger for cooling the electrical components separately from a cooling fan for cooling the battery. Additionally, in the case where a cooling fan for cooling the electrical components is provided within the charger, it is necessary to provide within the housing of the charger an intake hole for taking in outside air as well as an exhaust hole for exhausting the air for cooling the electrical components. In the case where both the intake hole and the exhaust hole are provided in the housing of the charger, if water that enters from the exhaust hole etc. and reaches the electrical components and the electrical circuit board, there is a risk that the charger may malfunction, which is to be countermeasured.

The present invention was conceived in order to overcome this known problem, and an object of the present invention is to prevent water, which may enter the charger housing from the exhaust hole or the intake hole of the housing of the charger from reaching the electrical circuit board.

SUMMARY

In a first aspect of the present disclosure, a charger houses an electrical circuit board and a cooling fan in a housing thereof. An intake hole and an exhaust hole are provided in the housing, where outside air that may flows through into the interior of the housing through the intake hole, may cool the charger, and subsequently said air that cools the interior of the housing may be discharged, said actions occurring when the cooling fan is driven. A first vertical wall that surrounds the intake hole or a region exposed to water that drops down the intake hole in a fence-shaped manner, and a second vertical wall that surrounds the exhaust hole or a region exposed by water that drops down the exhaust hole in a fence-shaped manner, are both provided projecting upward from a bottom plate of the housing. Furthermore, the electrical circuit board is disposed outward of an area where the first vertical wall surrounds the intake hole or the region exposed to water that drops down the intake hole. The electrical circuit board is also disposed outward of an area where the second vertical wall surrounds the exhaust hole or the region exposed to water that drops down the exhaust hole.

According to the first aspect of the present disclosure, the intake hole or the region exposed to water that drops down the intake hole is surrounded by the first vertical wall provided on the bottom plate of the housing. Because of this configuration, water that enters from the intake hole to the interior of the housing or water that drops down the intake hole remains within the region surrounded by the first vertical wall. Furthermore, the exhaust hole or the region exposed to water that drops down the exhaust hole is surrounded by the second vertical wall provided on the bottom plate of the housing. Because of this configuration, water that enters from the exhaust hole to the interior of the housing or water that drops down the exhaust hole remains within the region surrounded by the second vertical wall. The electrical circuit board is disposed outward of the area where the first vertical wall surrounds the intake hole or the region exposed to water that drops down the intake hole, and also disposed outward of the area where the second vertical wall surrounds the exhaust hole or the region exposed to water that drops down the exhaust hole. Because of this configuration, water that enters from the intake hole or the exhaust hole is blocked by the first vertical wall as well as the second vertical wall, respectively, and thus water is prevented from reaching the electrical circuit board and the electrical components on the electrical circuit board.

In a second aspect of the present disclosure, the intake hole is formed on a lower portion of the housing and surrounded by the first vertical wall, and the exhaust hole is formed on the lower portion of the housing and surrounded by the second vertical wall. In this way, both the intake hole and the exhaust hole are formed on the lower portion of the housing, and thus water is prevented from entering the intake hole as well as from the exhaust hole into the interior area housing the electrical circuit board.

In a third aspect of the present disclosure, when a lower end of the intake hole is higher than an upper end of the first vertical wall in the up-to-down direction, the intake hole is configured to be surrounded by a third vertical wall such that water that enters from the intake hole drops down along the third vertical wall to a region surrounded by the first vertical wall, and when a lower end of the exhaust hole is higher than an upper end of the second vertical wall in the up-to-down direction, the exhaust hole is configured to be surrounded by a third vertical wall such that water that enters from the exhaust hole drops down along the third vertical wall to a region surrounded by the second vertical wall. In this way, by providing the third vertical wall, water that enters from the intake hole of the exhaust hole provided on the upper portion of the housing can be efficiently guided to the region surrounded by the first vertical wall or the region surrounded by the second vertical wall.

In a fourth aspect of the present disclosure, the intake hole is formed on a lower portion of the housing and surrounded by the first vertical wall, the exhaust hole is formed on an upper portion of the housing and surrounded by the third vertical wall, and a region exposed by water that drops down the exhaust hole along the third vertical wall is surround by the second vertical wall. In this way, the exhaust hole is formed on the upper portion of the housing, and thus warmed air in the housing can be efficiently discharged to the outside.

In a fifth aspect of the present disclosure, the intake hole is formed on an upper portion of the housing and is surrounded by the third vertical wall, the exhaust hole is formed on a lower portion of the housing and surrounded by the second vertical wall, and a region exposed by water that drops down the exhaust hole along the third vertical wall is surrounded by the first vertical wall.

In a sixth aspect of the present disclosure, the electrical circuit board is disposed above along the bottom plate of the housing, and when the intake hole is formed on the lower portion of the housing, the upper end of the intake hole is positioned so as to be lower than the upper end of the first vertical wall in the up-do-down direction, and when the exhaust hole is formed on the lower portion of the housing, the upper end of the exhaust hole is positioned so as to be lower than the upper end of the second vertical wall in the up-to-down direction. Because of this configuration, the electrical circuit board is prevented from being exposed to water that enters the interior of the charger from either the intake hole or the exhaust hole.

In a seventh aspect of the present disclosure, the intake hole is formed on one end side of the housing in a plan view and the exhaust hole is formed on the other end side of the housing in the plan view. Because of this configuration, air that is taken from the intake hole flows approximately through the entire surface area within the housing and is then discharged from the exhaust hole to the outside.

In a eighth aspect of the present disclosure, a drain hole is formed on the bottom part of the housing in a region surrounded by the first vertical wall or the second vertical wall that is configured to receive water that drops down the intake hole or the exhaust hole. Because of this configuration, water, which enters from the intake hole or the exhaust hole of the upper portion of the housing to the interior of the housing, drops and remains within the region surrounded by the first vertical wall or the second vertical wall, can be efficiently discharged by the drain hole.

In a ninth aspect of the present disclosure, the cooling fan is disposed in the vicinity of the first vertical wall or the second vertical wall such that an axis about which the cooling fan rotates is approximately horizontal in the left-to-right direction, and an intake side of the cooling fan is directed to the intake hole as seen in a plan view. Because of this configuration, the cooling fan can efficiently suck outside air from the intake hole. In addition, the cooling fan can flow the air along the electrical circuit board in the housing, and thus the electrical components on the electrical circuit board can be efficiently cooled.

In a tenth aspect of the present disclosure, the cooling fan is disposed such that a lower end of the cooling fan is retained approximately as high as the electrical circuit board or below the electrical circuit board. Because of this configuration, the cooling fan can flow the air to a lower area of the housing.

In an eleventh aspect of the present disclosure, the third vertical wall that surrounds the intake hole or the exhaust hole is formed on a ceiling portion of the housing, and a guide wall is formed outward of a region surrounded by the third vertical wall such that the guide wall guides airflow between a region surrounded by the third vertical wall and the ceiling portion of the housing. Because of this configuration, air does not remain stuck at an inner peripheral corner at the intersection of the outward of the region surrounded by the third vertical wall and the ceiling surface of the housing.

In a twelfth aspect of the present disclosure, the third vertical wall that surrounds the intake hole or the exhaust hole is formed on a ceiling portion of the housing, and a protruding length of the third vertical wall is configured such that an protruding end of the third vertical wall below the ceiling portion of the housing is lower than a lower end of the intake hole or the exhaust hole in the up-to-down direction. Because of this configuration, when water enters from the intake hole or the exhaust hole, the water is blocked by the third vertical wall and is prevented from reaching outward of the region surrounded by the third vertical wall.

BRIEF DESCRIPTION OF THE DRAWINGS

FIG. 10 is a schematic longitudinal sectional view showing an interior of a housing of the charger according to a modified example 4.

DETAILED DESCRIPTION OF EMBODIMENTS

Embodiment 1

A charger according to an embodiment 1 of the present invention will be described below with reference to FIGS. 1 to 10. A charger 10 according to the present invention is a charger for charging a battery 50 used for an electric power tool. The front, rear, left, right, up and down directions shown in the figures correspond to the front, rear, left, right, up and down directions relative to the charger 10.

<General Configurations of Charger 10>

Figure 1:
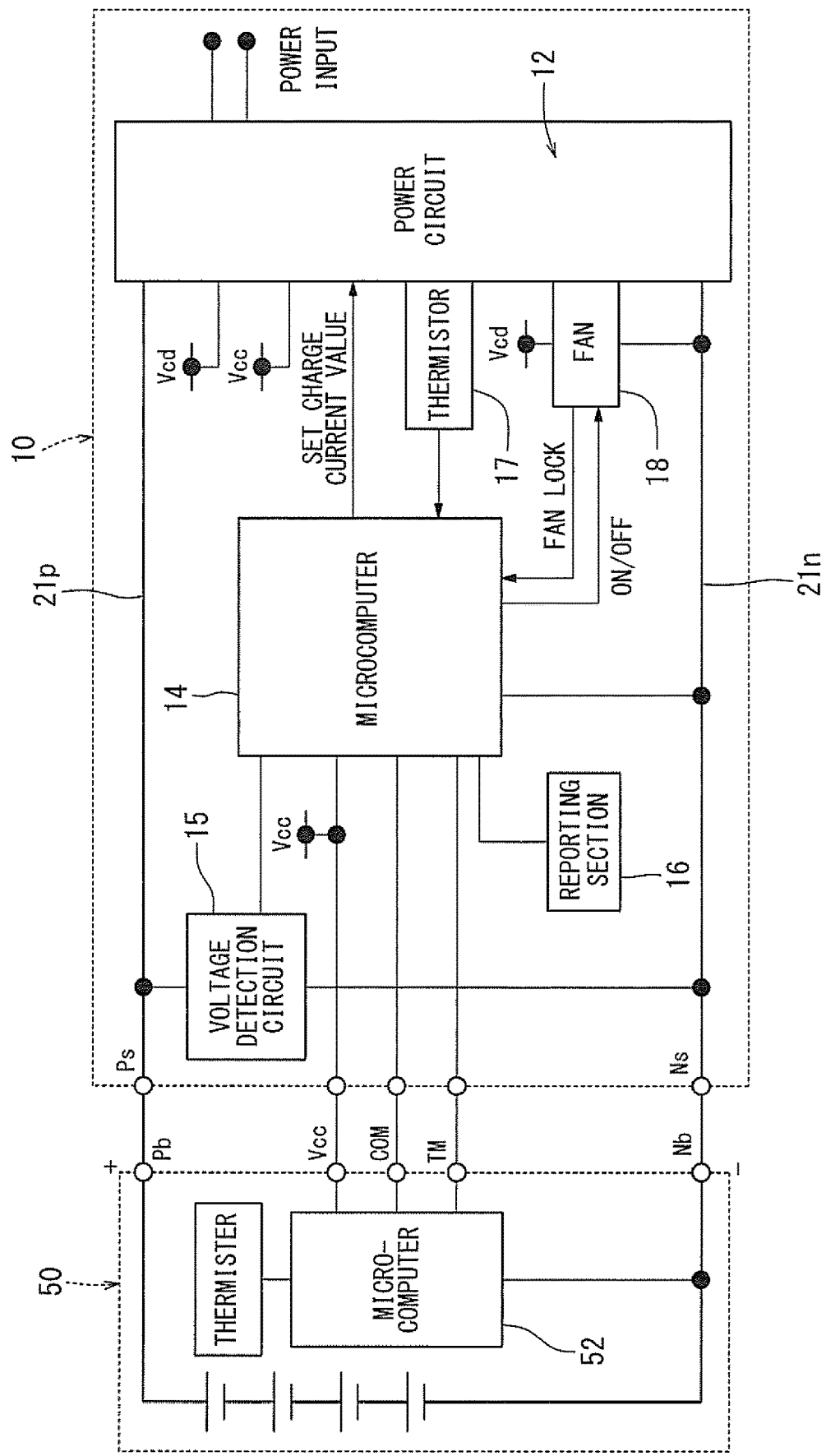
FIG. 1 is a wiring block diagram showing a connection state between a battery and a charger according to an embodiment of the present invention.
Figure 2:
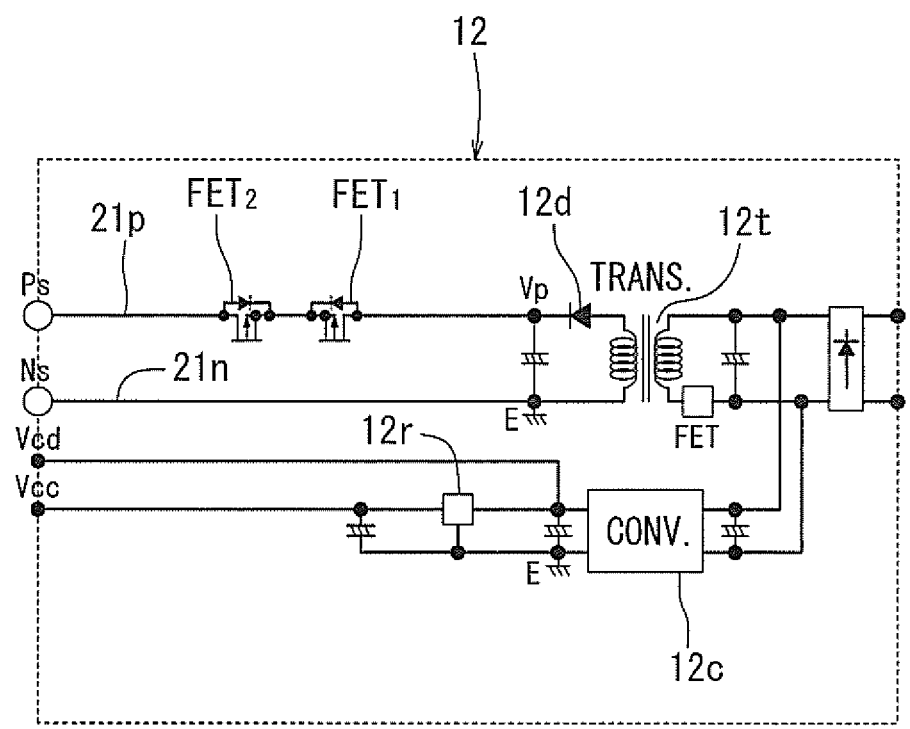
FIG. 2 is a schematic circuit diagram showing an electric power circuit of the charger.

As shown in FIG. 1 depicting a wiring block diagram, the charger 10 comprises an electric power circuit 12, a microcomputer 14, a cooling fan 18 and a voltage detection circuit 15 etc. As shown in FIG. 2, the electric power circuit 12 is an electric circuit including a DC power source (Vp) for charge as well as a DC power source (Vcd, Vcc) for control by converting AC power from a domestic AC power source (power source input, e.g. mains) to DC power. The DC power source (Vp) for charge in the electric power circuit 12 is a power source used for charging the battery 50 (refer to FIG. 1). As shown in FIG. 2, a power voltage is lowered to a predetermined voltage by a transformer 12t, and then the lowered voltage is converted to a DC voltage by a diode 12d. A thermistor 17 (refer to FIG. 1) for detecting the temperature of the transformer 12t or the diode 12d is mounted on the corresponding transformer 12t or diode 12d, respectively.

As shown in FIG. 2, switching elements FET1 and FET2 are provided as part of a power source positive line 21p of the DC power source for charge (Vp), and the power source positive line 21p is in turn connected to a positive terminal Ps of the charger 10. Furthermore, a power source negative line 21n of the DC power source for charge (Vp) is connected to a negative terminal Ns of the charger 10, while at the same time it is also connected at a different location along line 21n to an earth terminal E as a ground connection. As shown in FIG. 1, the positive terminal Ps and the negative terminal Ns of the charger 10 are connected to corresponding positive terminal Pb and negative terminal Nb of the battery 50, respectively, when the battery 50 is connected to the charger 10. Furthermore, the difference in voltage between the positive terminal Ps and the negative terminal Ns of the charger 10 is configured to be detected by a voltage detection circuit 15.

The DC power source (Vcd) for control in the electric power circuit 12 is a DC 12V source used for operating the cooling fan 18 etc, and wherein the source is formed by converting AC power of the AC power source to DC power by an AC-DC converter 12c. The cooling fan 18 is a fan for cooling the electric power circuit 12 when the temperature of the transformer 12t or the diode 12d of the electric power circuit 12 as detected by the thermistor 17 increases above a predetermined value while the battery 50 is being charged. In the figures, a fan for cooling the battery 50 is omitted but may be present in the disclosure. Another DC power source (Vcc) for control in the electric power circuit 12 is a DC 5V source which may be used for operating the microcomputer 14 etc., wherein the source is formed by lowering the output voltage (12V) of the converter 12c by using a voltage regulator 12r.

The microcomputer 14 is a microprocessor-based controller which runs control routines for a charge control of the battery 50 based on sensed information from the battery 50 that is connected to the charger 10, and furthermore the microcomputer 13 is configured to switch on/off of the switching elements FET1 and FET2 in the electric power circuit 12 (on the power source positive line 21p outputted from DC power source (Vp) for charge). For this operation, as shown in FIG. 1, when the battery 50 is connected to the charger 10, the microcomputer 14 is connected to another microcomputer controller 52 of the battery 50 via a digital communication terminal COM, an analog signal terminal TM and via a microcomputer power terminal Vcc.

Furthermore, the microcomputer 14 is configured to process the voltage signal from the voltage detection circuit 15 as an input. Because of this connection (shown by the thin black line from the voltage detection circuit 15 to the microcomputer 14 in FIG. 1), the microcomputer 14 can detect an output voltage of the battery 50 when the battery 50 is connected to the charger 10. Furthermore, via the output voltage, the microcomputer 14 can also detect whether the battery 50 is connected to the charger 10. Furthermore, the microcomputer 14 is also configured to process the temperature signal from the thermistor 17 as well as a fan lock signal (failure signal) from the cooling fan 18 as input, as shown by the appropriate arrows in FIG. 1. In addition, the microcomputer 14 is also configured to drive the cooling fan 18 based on the temperature signal of the thermistor 17 etc. Furthermore, the microcomputer 14 is also configured to output signals relating to a charging state, a temperature state and a driving state of the cooling fan 18 to a reporting section 16.

<Housing 30 (Upper Housing 31) of Charger 10>

Figure 3:
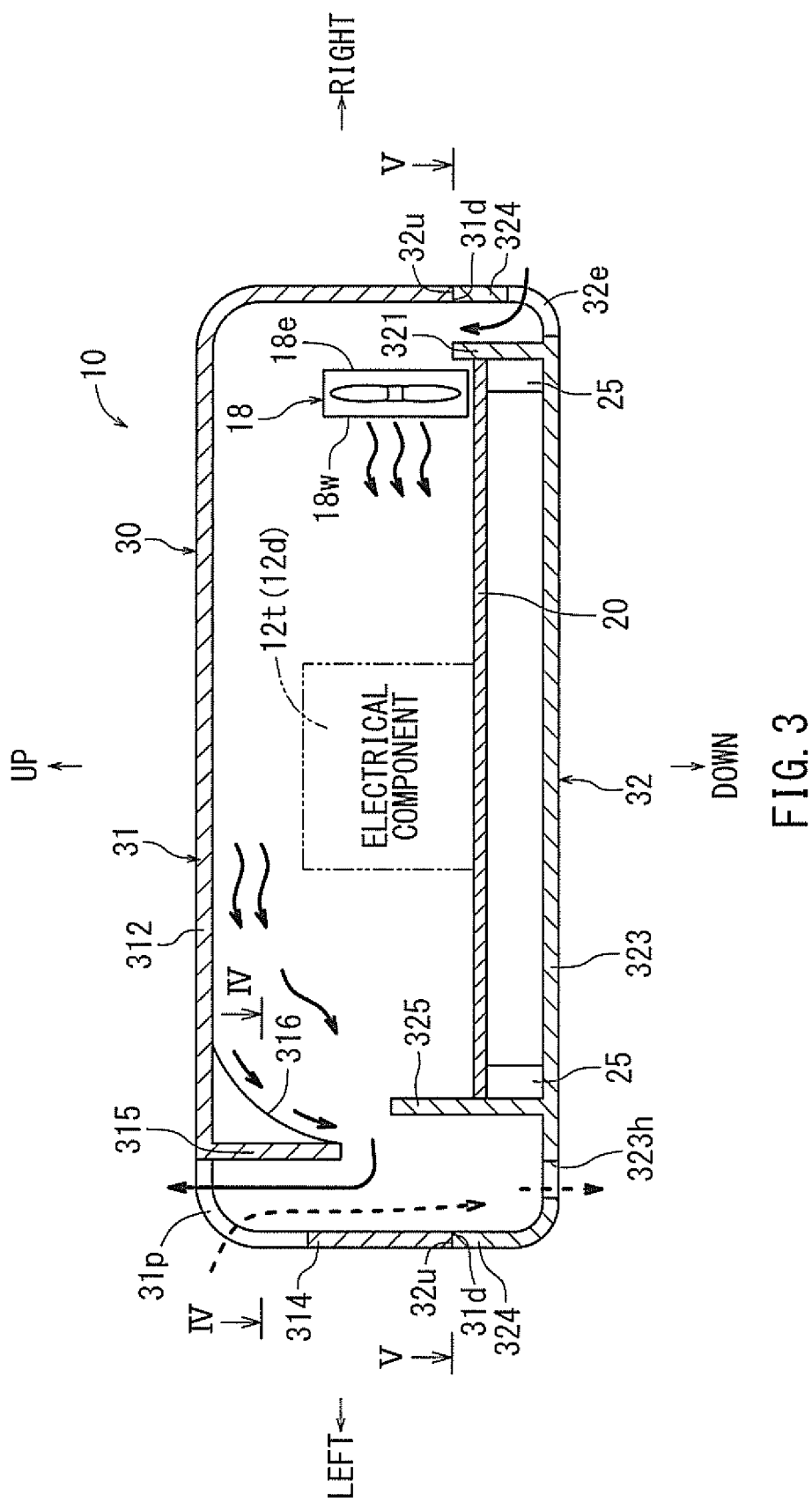
FIG. 3 is a schematic longitudinal sectional view showing an interior of a housing of the charger.

As shown in FIG. 3, the housing 30 of the charger 10 comprises an upper housing 31 and a lower housing 32, each of which has an approximately rectangular shape as seen from a side view. The upper housing 31 is a lid-shaped case that covers the electric components mounted on the upper surface of the lower housing 32 from above. A connection portion (not shown in the figures) that connects to the battery 50 is formed on the outer peripheral upper surface of the upper housing 31. Furthermore, the positive terminal Ps, the negative terminal Ns, the digital communication terminal COM, the analog signal terminal TM and the microcomputer power terminal Vcc are also provided on the connection portion of the upper housing 31.

Figure 4:
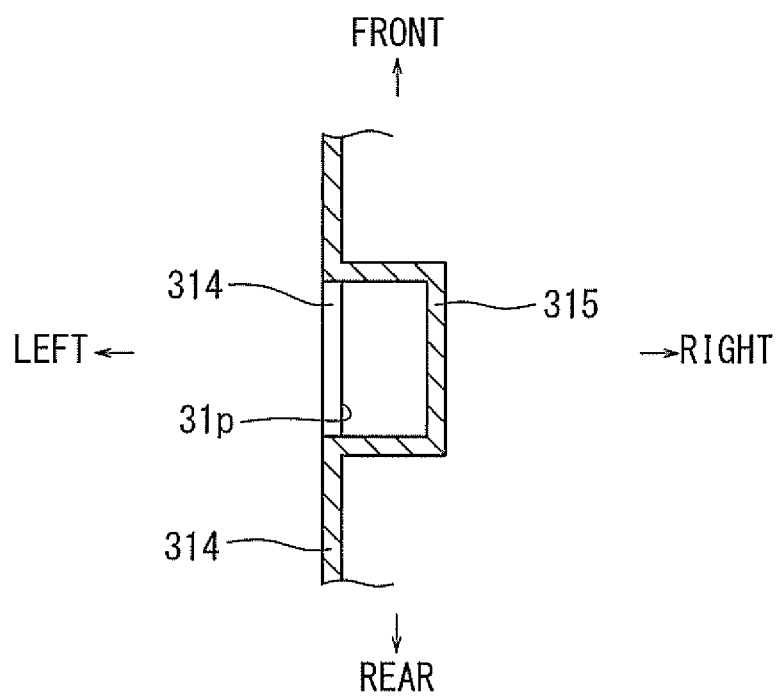
FIG. 4 is a plan sectional view showing an exhaust hole of an upper housing and a vertical wall on a ceiling side (a third vertical wall).

As shown in FIGS. 3 and 4, an exhaust hole 31p for discharging air within the interior of the housing 30 is formed on the upper left portion of the periphery of the upper housing 31, i.e., on an upper left corner at the intersection of a ceiling portion 312 of the upper housing 31 and an outer circumferencial vertical wall 314, approximately at the center of the upper housing 31 in the front-to-rear direction (where the front-to-rear direction is perpendicular to the cross-sectional plane shown in FIG. 3). Furthermore, a ceiling-side vertical wall 315 having a U shape rotated by 90 degrees counterclockwise as seen in the plan view of FIG. 4 is formed to project inward towards the interior of the upper housing 31 such that it surrounds the exhaust hole 31p on three sides, i.e., from the frontward, the rearward and the rightward sides. The ceiling-side vertical wall 315 is a vertical wall protruding downward from the ceiling portion 312 of the upper housing 31, and as shown in FIG. 4, the left edges of the ceiling-side vertical wall 315 are joined to the inner wall surface of the outer circumferencial vertical wall 314 that constitutes the upper housing 31.

In other words, as shown in FIG. 4, the outer circumferential vertical wall 314 and the ceiling-side vertical wall 315 collectively surround the exhaust hole 31p. Because of this structural configuration, even if water enters the housing 30 from the exhaust hole 31p into the interior of the upper housing 31, upon entry the water contacts the ceiling-side vertical wall 315, and drops down the ceiling-side vertical wall 315 etc. Furthermore, as shown in FIG. 3, a protruding length of the ceiling-side vertical wall 315 below the ceiling portion 312 of the upper housing 31 in the downward direction is configured such that a lower end position of the ceiling side vertical wall 315 is positioned lower than a lower end position of the exhaust hole 31p in the up-to-down direction.

Furthermore, a guide wall surface 316 having a recessed arc surface in the cross-sectional view as shown in FIG. 3 is formed to curve downward and leftward from a point spaced rightward on the internal periphery of the ceiling portion 312 toward the lower terminal end of the ceiling side wall 15, outside an area surrounded by the ceiling-side vertical wall 315 as shown in FIG. 4 and described above. The guide wall surface 316 prevents air flowing in the housing 30 from remaining stuck in the upper left corner at the intersection of the ceiling portion 312 and the ceiling-side vertical wall 315, and channels the air downward and leftward toward the exhaust hole 31p following the curve of the surface. The ceiling-side vertical wall 315 surrounding the exhaust hole 31p is referred to as a third vertical wall.

<Lower Housing 32>

Figure 5:
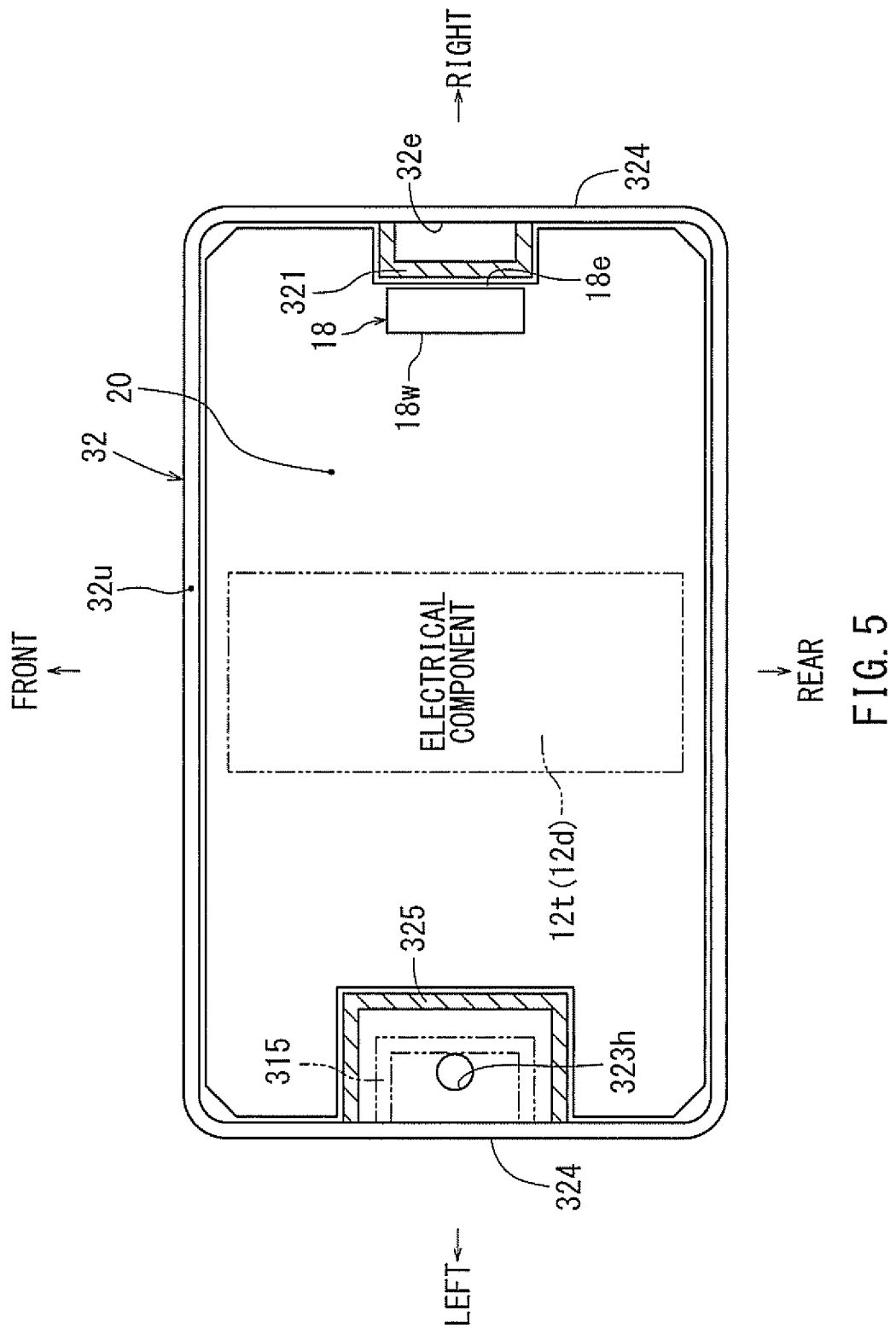
FIG. 5 is a schematic plan view showing an entirety of a lower housing and an electrical circuit board.

The lower housing 32 is an open-top-type case in which the electrical components of the charger 10 such as the electrical circuit board 20, the transformer 12t and the diode 12d of the power circuit 12, the microcomputer 14, and the cooling fan 18 etc. are housed. As shown in FIG. 3, the lower housing 32 is joined to the upper housing 31 by aligning and screw-fastening an upper joining portion 32u of the lower housing 32 with a lower joining portion 31d of the upper housing 31. As shown in FIGS. 3 and 5, an intake hole 32e for allowing outside air to flow into the interior of the housing 30 is formed on a lower right side of the periphery of the lower housing 32, i.e., on a right corner at the intersection of a bottom plate 323 of the lower housing 32 and the outer circumferential vertical wall 324, approximately at the center of the lower housing 32 in the front-to-rear direction (where the front-to-rear direction is perpendicular to the cross-sectional plane shown in FIG. 3).

Furthermore, a right-side vertical wall 321 having a U shape rotated 90 degrees clockwise as shown in the plan view of FIG. 5 is provided inside the lower housing 32 such that it surrounds the intake hole 32e in a fence-shaped manner on three sides, i.e. in the frontward, the rearward and the leftward sides. The right-side vertical wall 321 is a vertical wall that is provided on the bottom plate 323 of the lower housing 32, and the right edges of the right-side vertical wall 321 are joined to the inner peripheral wall surface of the outer circumferential vertical wall 324 that constitutes the lower housing 32. In other words, as shown in FIG. 5, the outer circumferential vertical wall 324 and the right-side vertical wall 321 collectively surround the intake hole 32e. An upper side of the outer circumferential vertical wall 324 and the right-side vertical wall 321 is open for allowing air to flow through. Because of this structural configuration, water that may enter the lower housing 32 from the intake hole 32e into the interior of the lower housing 32 is blocked from penetrating further by the right-side vertical wall 321. To achieve the blockage, the height of the right-side vertical wall 321 is configured such that an upper end position of the right-side vertical wall 321 is higher than an upper end position of the intake hole 32e. The right-side vertical wall 321 is referred to as a first vertical wall that surrounds the intake hole 32e.

As shown in FIGS. 3 and 5, in a manner similar to the right-side vertical wall 321. a left-side vertical wall 325 is provided on a lower left side of the lower housing 32. The left-side vertical wall 325 is formed so as to have a U shape rotated by 90 degrees counterclockwise as shown in the plan view of FIG. 5, and is formed to surround a region exposed to water (refer to the two-dot chain line shown at the left end part of FIG. 5), which may enter the upper housing 31 from the exhaust hole 31p and may drop down the ceiling-side vertical wall 315. The left-side vertical wall 325 surrounds said region from the frontward, the rearward and the rightward directions. The left-side vertical wall 325 is provided on the bottom plate 323 of the lower housing 32 and the left edges of the left-side vertical wall 325 are joined to the inner wall surface of the outer circumferential vertical wall 324 that constitutes the lower housing 32. Furthermore, a drain hole 323h is formed on the bottom plate 323 at the center of a region surrounded by the outer circumferential vertical wall 324 and the left-side vertical wall 325 as shown in FIGS. 3 and 5.

Because of this configuration, water, which may enter from the exhaust hole 31p into the interior of the upper housing 31 and may drop down the ceiling side vertical wall 315 etc., may drop on the bottom plate 323 that is collectively surrounded by the left-side vertical wall 325 of the lower housing 32 and the outer circumferential vertical wall 324. Then, the water may be discharged from the drain hole 323h. The height of the left-side vertical wall 325 is configured to be larger than that of the right-side vertical wall 321. Furthermore, the height of the left-side vertical wall 325 is determined relative to a positional relationship between a lower end of the ceiling side vertical wall 315 and the left-side vertical wall 325. That is, the height of the left-side vertical wall 325 is determined such that the height of the wall is designed to be high enough so that any water that may drop from the ceiling-side vertical wall 315 due to gravitational flow would never fail to drop within an area surrounded by the left-side vertical wall 325. In addition, the height of the left-side vertical wall 325 is also determined such that airflow in the housing 30 (refer to the black directional arrows) is not blocked. For the water from the ceiling-side vertical wall 315 to drop within the area surrounded by the left-side vertical wall 325 without fail, it is preferable that the lower terminal end of the ceiling-side vertical wall 315 is configured to be lower than the upper terminal end of the left-side vertical wall 325 in the up-to-down direction. However, this configuration may block the airflow and in the said case, eventually cooling efficiency of the charger 10 may decrease. Even in the case where the lower terminal end of the ceiling-side vertical wall 315 is lower than the upper terminal end of the left-side vertical wall 325, if a distance between the ceiling-side vertical wall 315 and the left-side vertical wall 325 is large enough, an airflow passage can be obtained. However, in order to obtain an adequate amount of airflow, an increased left-to-right distance between the ceiling-side vertical wall 315 and the left-side vertical wall 325 would be needed. This larger left-right distance between the ceiling-side vertical wall 315 and the left-side vertical wall 325 would cause another problem of increasing a dimension of the charger 10. Because of these constraints, in order to accomplish adequate waterproof performance as well as adequate cooling performance, an upper end of the left-side vertical wall 325 is positioned to be slightly lower than a lower end of the ceiling-side vertical wall 315 such that the former is close to the latter as much as possible in the up-to-down direction. The left-side vertical wall 325 is referred to as a second vertical wall that surrounds a region exposed to water that drops from the exhaust hole 31p.

As shown in FIG. 5, the electrical circuit board 20 is housed in the lower housing 32 outward of both a region surrounded by the left-side vertical wall 325 as well as a region surrounded by the right-side vertical wall 321. As shown in FIG. 3, the electrical circuit board 20 is placed parallel to and spaced apart vertically from the bottom plate 323 of the lower housing 32. This is accomplished by the end edges of the electrical circuit board 20, which are supported from below by a plurality of support legs 25. The upper end of the right-side vertical wall 321 is configured to be higher than the upper end of the intake hole 32e in the up-to-down direction so as to block flow of water as previously described. Furthermore, the electrical circuit board 20 is configured to be positioned to be lower than the upper end of the left-side vertical wall 325 as well as the upper end of the right-side vertical wall 321 in the up-to-down direction, so as to be shielded from the water blocked by both walls, respectively.

Electrical components of the charger 10 such as the transformer 12t, the diode 12d, the microcomputer 14, and the cooling fan 18 etc. are mounted on the electrical circuit board 20. As shown in FIGS. 3 and 5, the cooling fan 18 is positioned on the electrical circuit board 20 such that the axis about which the fan rotates is approximately horizontally in the left-to-right direction. The cooling fan 18 is positioned in the vicinity of the right-side vertical wall 321 such that an intake side 18e of the cooling fan 18 is directed to the intake hole 32e of the lower housing 32. Furthermore, a blowing side 18w of the cooling fan 18 is directed to the electrical components such as the transformer 12t, the diode 12d etc.

<Operation of Charger 10>

Figure 6:
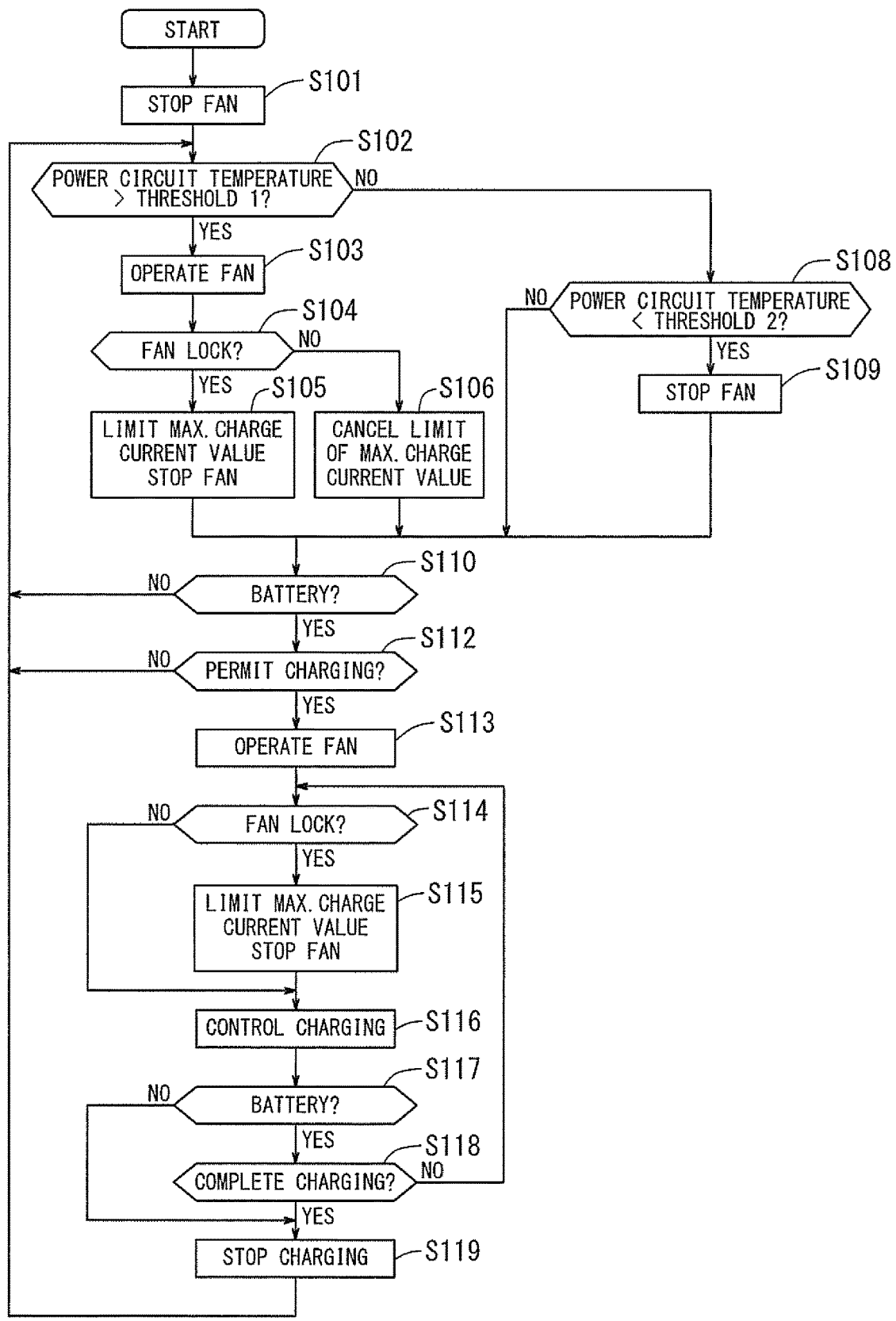
FIG. 6 is a flowchart showing an operation of the charger.

Next, operation of the charger 10 is described according to the flowchart shown in FIG. 6. The procedure as shown in the flowchart of FIG. 6 is executed by a program stored in the memory of the microcomputer 14. When power is supplied to the charger 10, the microcomputer 14 runs and the program starts. At an initial stage, the cooling fan 18 is held in a stopped state (step S101). Next, in step S102, the sensed temperature of the electrical components in the charger 10 is compared to a threshold value 1, wherein the sensed temperature of the electrical components is the temperature of the transformer 12t or the diode 12d measured by the thermistor 17. Furthermore, the threshold value 1 is set to, for example, approximately 50°. In step S102, if the temperature of the electrical components is lower than threshold value 1 (NO in step S102), then the temperature of the electrical components is compared to a second threshold value 2 in step S108. The threshold value 2 is lower than the threshold value 1 and set to, for example, approximately 40°.

When the temperature of the electrical components is lower than the threshold value 2 (yes in step S108), the cooling fan 18 is held in the stopped state (step S109). Next, whether or not the battery 50 is connected to the charger 10 is judged in step S110. The connection of the battery 50 is judged by detecting a voltage from the voltage detection circuit 15 by the microcomputer 14 of the charger 10 or alternatively by whether or not data from the other microcomputer 52 of the battery 50 is received. When the battery 50 is not connected to the charger 10, the procedure returns to step S102. When the temperature of the electrical components exceeds the threshold value 1 (YES in step S102), power is supplied to the cooling fan 18 and the cooling fan 18 is driven (step S103). Next, whether or not the microcomputer 14 receives a fan lock signal is judged in step S104.

The fan lock signal is a signal that is transmitted from the cooling fan 18 to the microcomputer 14 when the cooling fan 18 breaks down. When the microcomputer 14 receives the fan lock signal (yes in step S104), the cooling fan is stopped. Furthermore, in a state where the cooling fan 18 is stopped, the microcomputer 14 sets a maximum charge current value (allowed maximum current value) that can be outputted to charge the battery 50 to prevent overheating. As a result, because of this setting, even in a case where the cooling fan 18 is stopped and while the battery 50 is being charged, the temperature of the electrical components does not exceed an allowed value due to the reduced value of the current outputted.

When the microcomputer 14 does not receive the fan lock signal (NO in step S104), i.e., the operation of the cooling fan 18 is proceeding as normal, operation of the cooling fan 18 continues and the limitation of the allowed maximum current value is removed. Because of this setting, the charger 10 can supply a necessary charge current to the battery 50 when connected to the battery 50. When the cooling fan 18 is driven in this way, the driving of the cooling fan 18 causes air from the outside to flow in through the intake hole 32e of the housing 30 (lower housing 32) of the charger 10 into the interior of the housing 30, wherein the air goes from the intake side 18e to the blowing side 18w of the cooling fan 18 as described above. Then, the electrical components such as the transformer 12t and the diode 12d etc. on the electrical circuit board 20 are cooled by the airflow supplied from the cooling fan 18. Air that is warmed after cooling the electrical components flows along the ceiling portion 312, and is guided to the lower side of the ceiling-side vertical wall 315 by the recessed guide wall surface 316, in a direction to the exhaust hole 31p. Then, in this manner, the air may pass from the lower side of the inner peripheral surface of the ceiling-side vertical wall 315 and may be discharged from the exhaust hole 31p to the outside of the housing 30, as shown by the arrow in FIG. 3.

Next, a connection state of the battery 50 with respect to the charger 10 is checked in step S110 of FIG. 6. When the battery 50 is not connected to the charger 10 (NO in step S110), the procedures from step S102 to step S110 are repeatedly executed. When the battery 50 is connected to the charger 10 (YES in step S110), whether or not a charge permission signal is input from the battery 50 is judged (step S112). When the charge permission signal is not input (NO in step S112), the procedures from step S102 to step S112 are repeatedly executed. When the charge permission signal is input (YES in step S112), the cooling fan 18 is driven (step S113). In this case, even if the temperature of the electrical components such as the transformer 12t or the diode 12d etc. is lower than the threshold value 1 and the threshold value 2, the cooling fan 18 is still driven. This is because the charging always increases the temperature of these electrical components and therefore the driving of the cooling fan 18 prevents a subsequent increase in temperature of these components.

Next, whether or not the fan lock signal is received is judged in step S114. If the fan lock signal is received (YES in step S114), then the cooling fan 18 is stopped. Then, after the maximum charge current value (allowed maximum current value) is set (step S115), the battery 50 is charged (step S116). When the fan lock signal is not received (NO in step S114), the cooling fan 18 continues to run and the battery 50 is charged without setting an allowed maximum current value (step S116). In a case where the battery is not removed from the charger 10 while the battery 50 is being charged (YES in step S117 and NO in step S118), the procedures from step S114 to step S118 are repeatedly executed. When the charging of the battery 50 is completed (YES in step S118), the charging is stopped and the procedure returns to step S102 (step S119). When the battery 50 is removed from the charger 10 while the battery 50 is being charged (NO in step S117), the charging is stopped and the procedure returns to step S102 (step S119).

<Benefits of the Charger 10 According to the Present Embodiment>

According to the charger 10 of the present embodiment, the intake hole 32e is surrounded by the right-side vertical wall 321 (first vertical wall) in the interior of the housing 30, in the lower housing 32. Because of this configuration, water that may enter from the intake hole 32e into the interior of the housing 30 is blocked from penetrating further inward by the right-side vertical wall 321 etc. Similarly, the exhaust hole 31p is surrounded by the ceiling-side vertical wall 315 (third vertical wall) in the interior of the housing 30. Furthermore, the left-side vertical wall (second vertical wall) that surrounds an area where water drops down due to gravitational forces from the ceiling-side vertical wall 315 is formed on the bottom plate 323 of the housing 30, projecting upward. Because of this configuration, water that may enter from the exhaust hole 31p into the interior of the housing 30 drops down from the ceiling-side vertical wall 315 etc. in the downward direction and is guided to the area surrounded by the left-side vertical wall 325. The electrical circuit board 20 is disposed outward of both the area surrounded by the left-side vertical wall 325 as well as the area surrounded by the right-side vertical wall 321 etc. Because of this configuration, when water enters from the intake hole 32e and from the exhaust hole 31p into the interior of the housing 30, it is prevented from reaching the electrical circuit board 20 and the electrical components housed therein.

Furthermore, the intake hole 32e is formed on the lower portion of the housing 30 so that its upper end is disposed slightly lower than the upper end of the right-side vertical wall 321 (first vertical wall) in the up-to-down direction, and thus water that may enter from the exterior of the charger 10 through the intake hole 32e into the interior of the housing 30 may be prevented from reaching the electrical circuit board 20. Furthermore, since the exhaust hole 31p is formed on the upper portion of the housing 30, proximate to the ceiling portion 312 of the housing 30 and its surroundings, the air that is warmed after cooling the electrical components can be efficiently discharged. Furthermore, the intake hole 32e is formed on the right side of the housing 30 and the exhaust hole 31p is formed on the left side of the housing 30. As a result, the air from the intake hole 32e flows approximately the entire surface area of the housing 30 before being discharged from the exhaust hole 31p.

Furthermore, the drain hole 323h is formed so as to be surrounded by the left-side vertical wall 325 etc. (second vertical wall) on the bottom plate 323 of the housing 30. Because of this configuration, water, which may enter from the exhaust hole 31p into the interior of the housing 30 and which may then drop down the ceiling-side vertical wall 315 due to gravitational force etc. (third vertical wall) and then remains in the area surrounded by the left-side vertical wall 325 etc., can be efficiently discharged through the drain hole 323h before water may accumulate to the extent it exceeds the height of the left-side vertical wall 325. In addition, the cooling fan 18 is disposed in the vicinity of the right-side vertical wall etc. such that the axis about which the fan rotates is disposed approximately horizontally in the left-to-right direction, and also the intake side 18e of the cooling fan 18 is directed to the intake hole 32e as shown in a plan view. Because of this configuration, the cooling fan 18 can efficiently take in the outside air from the intake hole 32e to the interior of the housing 30. Furthermore, the air flows along the electrical circuit board 20 in the housing 30 due to the cooling fan 18, and thus the electrical components on the electrical circuit board 20 can be efficiently cooled.

Furthermore, the guide wall 316, which guides the air flowing along the ceiling portion 312 of the housing 30 to the area surrounded by the ceiling-side vertical wall 315 etc., is formed outward of the region surrounded by the ceiling-side vertical wall 315 etc. that surrounds the exhaust hole 31p. Because of this configuration, the air does not remain at the upper left corner of the inner peripheral boundary of the ceiling-side vertical wall 315 etc. and of the ceiling surface of the housing 30. Furthermore, a protruding length of the ceiling-side vertical wall 315 is set such that the protruding end of the ceiling-side vertical wall 315 below the ceiling portion 312 of the housing 30 is lower than the lower end of the exhaust hole 31p. Because of this configuration, even if water enters from the exhaust hole 31p, the water is blocked by the ceiling-side vertical wall 315 and does not reach outward of the region surrounded by the ceiling-side vertical wall 315, and is thus prevented from reaching the interior of the housing 30.

<Modifications>

Figure 7:
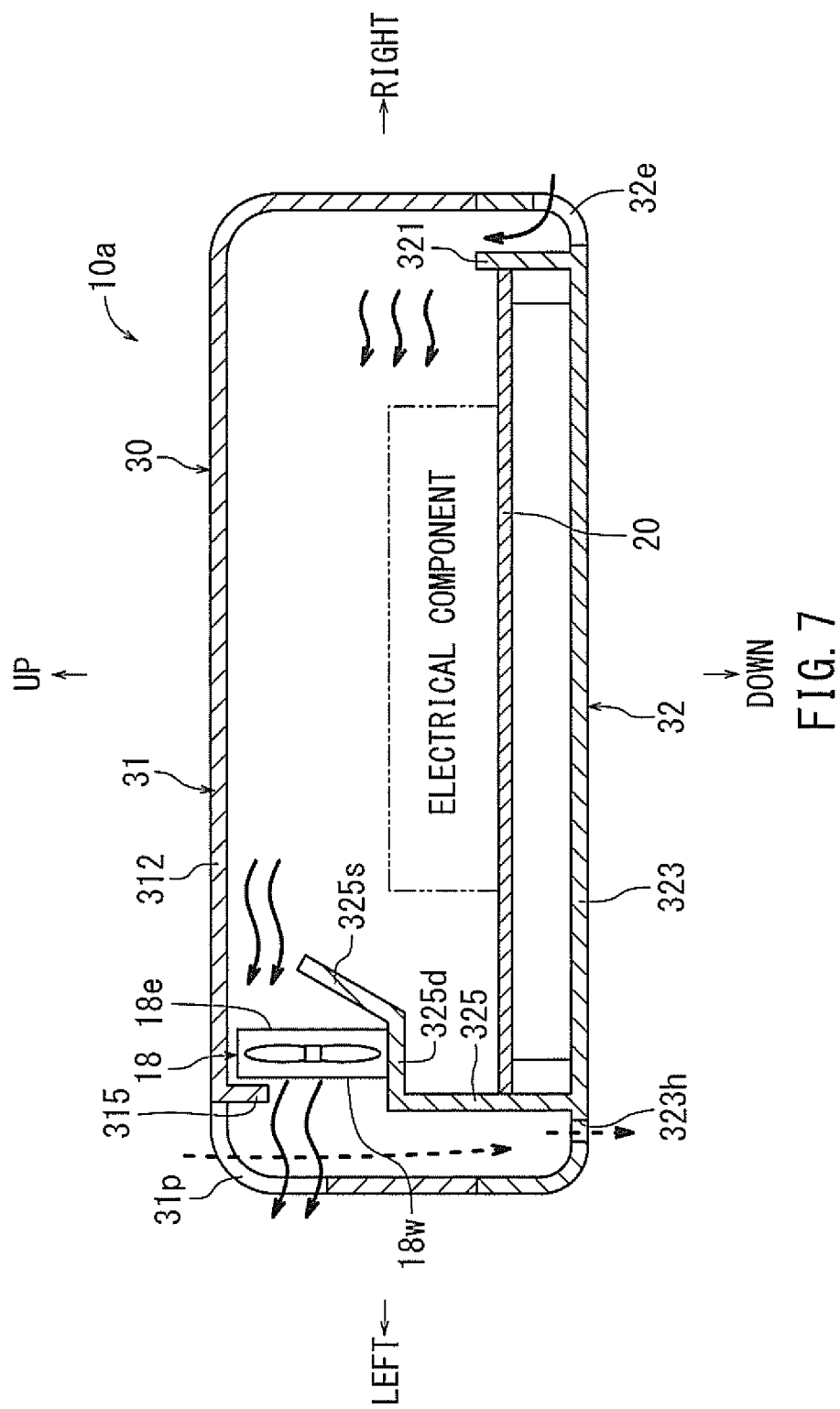
FIG. 7 is a schematic longitudinal sectional view showing an interior of a housing of the charger according to a modified example 1.

The embodiment of the present invention has been explained referring to the above configurations, but it is apparent for a person with ordinary skill in the art that manifold alterations, improvements and modifications can be made without departing from the aim of the present invention. Therefore, the embodiment of the present invention can contain all alterations, improvements and modifications that do not depart from the spirit and aim of the appended claims. The embodiment of the present invention can be modified in the following way without limiting to a specified configuration. For example, the present embodiment has provided the example in which the cooling fan 18 is disposed in the vicinity of the intake hole 32e of the housing 30. However, as shown in FIG. 7, it is possible that the cooling fan 18 is disposed in the vicinity of the exhaust hole 31p (modification 1).

<Modification 1>

In a charger 10a according to the modification 1, a left-side vertical wall 325s (second vertical wall), which is provided on the left side of the bottom plate 323 of the lower housing 32, extends to nearly the exhaust hole 31p in the upward direction and a stand 325d on which the cooling fan 18 is placed is formed on an upper inwardly-directed portion of the left-side vertical wall 325. Furthermore, the circumference of the stand 325d of the left-side vertical wall 325 is surrounded by an inclined vertical wall 325s. The cooling fan 18 is placed on the stand 325d of the left-side vertical wall 325 such that the blowing side 18w is directed to the exhaust hole 31p.

Because the inclined vertical wall 325s provided around the stand 325d is inclined, a space is formed between the intake side 18e of the cooling fan 18 and the inclined vertical wall 325s, and accordingly due to said space being formed air intake is adequate and not blocked. Furthermore, the ceiling-side vertical wall 315 protruding below the ceiling portion 312 of the upper housing 31 in the downward direction supports the upper side surface of the blowing side 18w of the cooling fan 18, and the protruding length is set so as not to hinder the airflow of the wind caused by the cooling fan 18. The ceiling-side vertical wall 315 protruding below the ceiling portion 312 in the downward direction is simply referred to as the third vertical wall. Because of this configuration, when the cooling fan is driven, the airflow is formed such that the outside air taken from the intake hole 32e is passed through the interior of the housing 30 and is discharged from the exhaust hole 31p due to the driving of the cooling fan 18. The electrical components in the housing 30 are cooled by this airflow.

<Modification 2>

Figure 8:
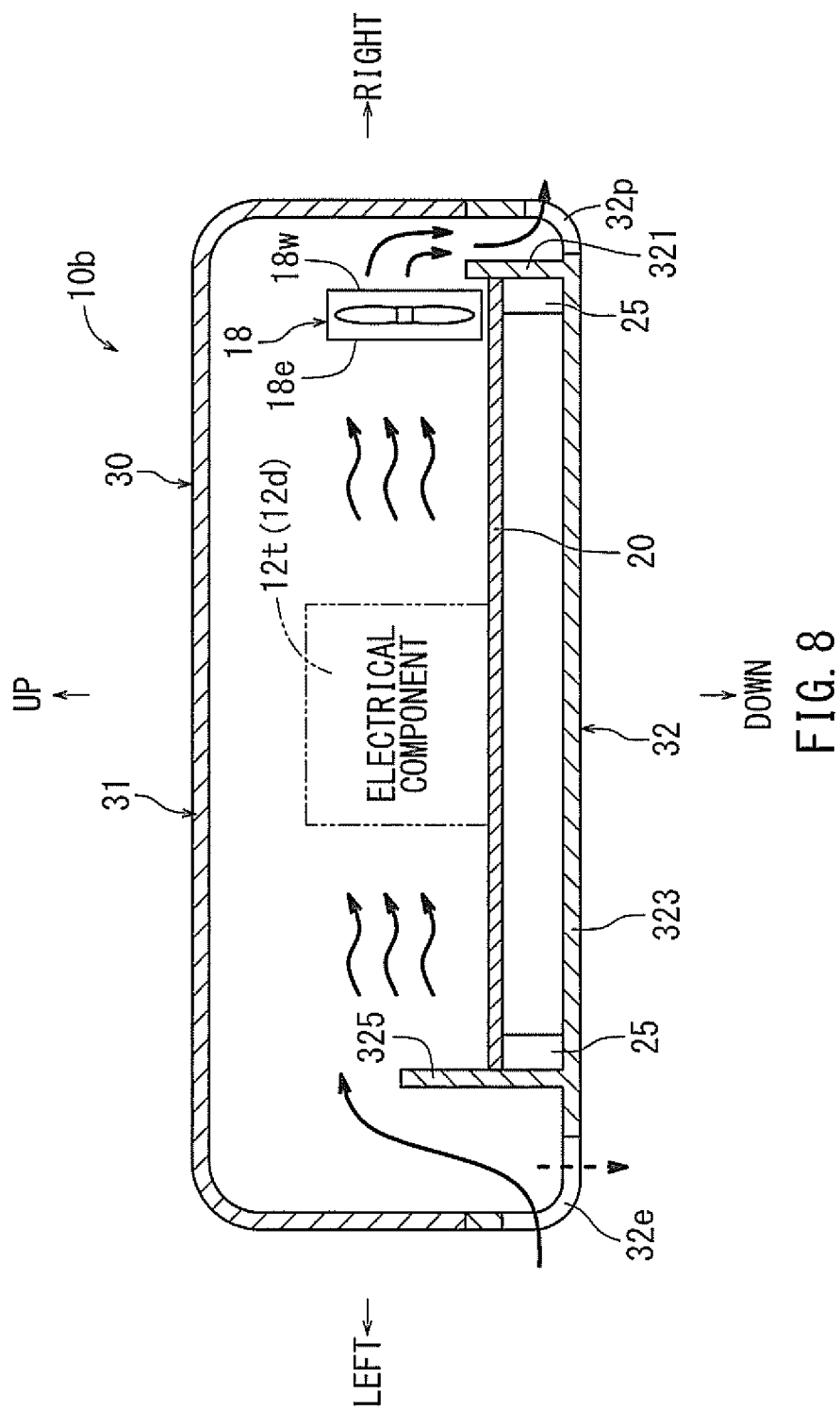
FIG. 8 is a schematic longitudinal sectional view showing an interior of a housing of the charger according to a modified example 2.

As shown in FIG. 8, in a charger 10b according to the modification 2, the intake hole 32e for channeling flow of outside air into the interior of the housing 30 is formed on the lower left side of the lower housing 32. Furthermore, the left-side vertical wall 325 that surrounds the intake hole 32e from the frontward, rearward and rightward sides in a fence-shaped manner is provided on the bottom plate 323 of the lower housing 32. Because of this, the left-side vertical wall 325 may be referred to as the first vertical wall. Furthermore, an exhaust hole 32p for discharging warmed air in the housing 32 is provided on the lower right side of the lower housing 32. Furthermore, the right-side vertical wall 321 that surrounds the exhaust hole 32p from the forward, rearward and leftward sides in a fence-shaped manner is provided on the bottom plate 323 of the lower housing 32. Because of this, the right-side vertical wall may be referred to as the second vertical wall.

As shown in FIG. 8, the electrical circuit board 20 is housed in the lower housing 32 between and outward of both the region surrounded by the left-side vertical wall 325 and the region surrounded by the right-side vertical wall 321. The cooling fan 18 is disposed on the electrical circuit board 20 in the vicinity of the right-side vertical wall 321, i.e. in the vicinity of the exhaust hole 32p. The cooling fan 18 is positioned such that the blowing side 18w of the cooling fan 18 is directed to the exhaust hole 32p. Because of this configuration, when the cooling fan 18 is driven, the outside air flows from the intake hole 32e of the lower portion of the housing 30, as shown in FIG. 8 toward the cooling fan 18, and then out of the blowing side 18w toward the exhaust hole 32p. The electrical components on the electrical circuit board 20 are cooled by the outside air, and the air warmed by the cooling of the electrical components is discharged from the exhaust hole 32p to the outside of the housing 30.

In this way, in the above discussed charger 10b, since an opening such as the exhaust hole is not formed on the upper housing 31, water is prevented from entering the interior of the housing 30. Furthermore, it is not necessary to provide the third vertical wall that guides water, and thus the upper housing 31 can be easily formed. Furthermore, since the lower end of the intake hole 32e as well as the lower end of the exhaust hole 32p is formed on the bottom plate 323 of the lower housing 32, both the lower end of the intake hole 32e and the lower end of the exhaust hole 32p can provide a dual use as drain holes, and thus it is not necessary to form another dedicated drain hole.

<Modification 3>

Figure 9:
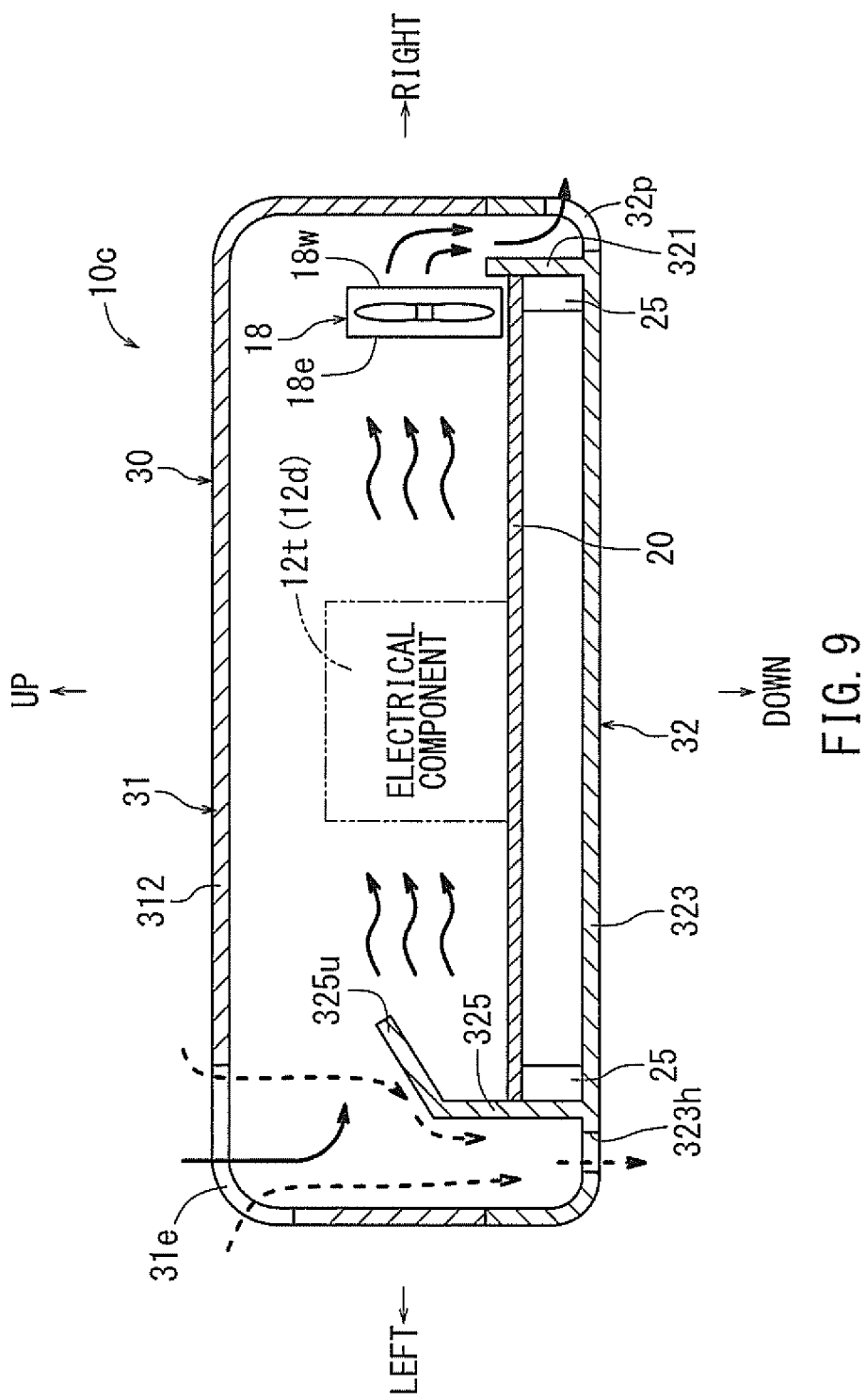
FIG. 9 is a schematic longitudinal sectional view showing an interior of a housing of the charger according to a modified example 3.

As shown in FIG. 9, in a charger 10c according to the modification 3, the intake hole 32e of the charger 10b according to the modification 2 is formed on the ceiling portion 312 of the upper housing 31 as intake hole 31e. As shown in FIG. 9, in the charger 20c according to the modification 3, an intake hole 31e is formed on the ceiling portion 312 of the upper housing 31, and thus the left-side vertical wall 325 of the lower housing 32 is configured to receive water that drops down from the intake hole 31e. In more detail, the left-side vertical wall 325 of the lower housing 32 is configured to be open expanding in the upward direction in a funnel-shaped manner to direct dripping water outward such that a region exposed to water that drops down from the intake hole 31e is surrounded by a vertical wall upper end 325u of the left-side vertical wall 325, which deflects the water outward from a right upper to a left downward direction, towards the drain hole 323h. Because of this configuration, a third vertical wall that surrounds the intake hole 31e can be eliminated. Furthermore, the drain hole 323h is formed on the bottom plate 323 of the lower housing 32 in the region surrounded by the left-side vertical wall 325. Because of this configuration, water that drops down from the intake hole 31e of the upper housing 31 is guided to the region surrounded by the left-side wall 325 of the lower housing 32 and discharged from the drain hole 323h.

<Modification 4>

As shown in FIG. 10, in a charger 10d according to the modification 4, the intake hole 32e of the charger 10b according to the modification 2 is formed on the ceiling portion 312 of the upper housing 31 as intake hole 31e. As shown in FIG. 10, the ceiling-side vertical wall 315 (third vertical wall) is provided so as to surround the intake hole 31e on the ceiling portion 312 of the charger 10d (upper housing 31) according to the modification 4. Because of this configuration, water that enters from the intake hole 31e to the interior of the housing 30 drops down along the ceiling-side vertical wall 315 due to gravitational force etc.

As shown in FIG. 10, the left-side vertical wall 325, which surrounds the region exposed to water that drops down along the ceiling-side vertical wall 315 of the upper housing 31, is provided on the bottom plate 323 of the lower housing 32. Furthermore, the drain hole 323h is formed on the bottom plate 323 of the lower housing 32 in the region surrounded by the left-side vertical wall 325. Because of this configuration, water that may enter from the intake hole 31e of the upper housing 31 and that may drop down along the ceiling-side vertical wall 315 is guided to the region surrounded by the left-side vertical wall 325 of the lower housing 32 due to the gravitational flow, and is then discharged from the drain hole 323h. In this way, by providing the ceiling-side vertical wall 315 on the upper housing 31, water that enters from the intake hole 31e to the interior of the housing 30 can be efficiently guided by gravity to the region surrounded by the left-side vertical wall 325 of the lower housing 32.

This embodiment provides the example in which the intake hole 31e and the exhaust hole 32p are formed at one end and at the other end, respectively, in the longitudinal direction of the housing 30. However, the intake hole 31e and the exhaust 32p can be respectively provided, for example, on the center portion of the housing 30 in the upward and downward directions. In this configuration, because the electrical circuit board 20 cannot be disposed at the center of the housing 30, it is necessary to form the electrical circuit board 20 in a frame-shaped manner.

What is claimed is:

1. A charger, comprising:
an electrical circuit board configured to generate a charging current;
a cooling fan configured to generate an airflow over the electric circuit board and electrical components mounted on the electrical circuit board and to not generate an airflow through a battery configured to receive the charging current;
a housing in which the electrical circuit board and the cooling fan are housed;
an intake hole that is formed on a lower portion or an upper portion of the housing, where outside air is taken from the intake hole when the cooling fan is driven;
an exhaust hole that is formed on a lower portion of the housing, where the outside air taken from the intake hole flows into an interior of and through the housing, thereby cooling the electrical circuit board and the electrical components mounted on the electrical circuit board and then discharged from the exhaust hole;

a first vertical wall that is formed on a bottom plate of the housing, where the first vertical wall surrounds in a fence-shaped manner, (i) the intake hole, or (ii) a region exposed to water that drops down the intake hole; and a second vertical wall that is formed on a bottom plate of the housing, where the second vertical wall surrounds the exhaust hole in the fence-shaped manner, wherein, the electrical circuit board is disposed outward of an area where the first vertical wall surrounds (i) the intake hole or (ii) the region exposed to water that drops down the intake hole, and the electrical circuit board is disposed outward of an area where the second vertical wall surrounds the exhaust hole; and the cooling fan is disposed adjacent to the exhaust hole and on a lateral side of the second vertical wall and between the first vertical wall and the second vertical wall.

2. The charger according to claim 1, wherein the cooling fan is disposed on the electrical board.

3. The charger according to claim 1, wherein an upper end of the exhaust hole is positioned so as to be lower than an upper end of the second vertical wall in an up-down direction.

4. The charger according to claim 1, wherein an upper end of the intake hole is positioned so as to be lower than an upper end of the first vertical wall in an up-down direction.

5. The charger according to claim 1, further comprising a drain hole that is formed through the bottom plate of the housing in a region surrounded by the first vertical wall, where the region is configured to receive water that drops down the intake hole.

6. The charger according to claim 5, wherein the first vertical wall of the bottom plate of the housing is configured to project straight upward for a predetermined length integrally from the bottom plate of the housing, and then form an upper terminal point that is configured to project further upward and toward the cooling fan, the upper terminal point configured to deflect water dripping downward from the intake hole toward the drain hole.

7. The charger according to claim 1, further comprising, a third vertical wall that is formed on the upper portion of the housing, wherein, a lower end of the intake hole is positioned so as to be higher than an upper end of the first vertical wall in an up-down direction;

the intake hole is configured to be surrounded by the third vertical wall of the upper portion of the housing such that water that enters from the intake hole drops straightly downward along the third vertical wall of the upper portion of the housing to a region surrounded by the first vertical wall; and a protruding length of the third vertical wall is configured such that an protruding end of the third vertical wall below the upper portion of the housing is higher than the upper end of the first vertical wall in the up-down direction.

8. The charger according to claim 7, wherein the protruding length of the third vertical wall is configured such that the protruding end of the third vertical wall below the upper portion of the housing is lower than the lower end of the intake hole in the up-down direction.

* * * * *